United States Patent
Davis, Jr. et al.

[11] Patent Number: 6,161,889
[45] Date of Patent: Dec. 19, 2000

[54] RIBBED TRIM PANEL FOR THERMAL SPRAYING OF ELECTRICAL CIRCUIT

[75] Inventors: Joseph J. Davis, Jr., Ortonville; Timothy F. O'Brien, White Lake, both of Mich.

[73] Assignee: Lear Automotive Dearborn, Inc., Southfield, Mich.

[21] Appl. No.: 09/178,841

[22] Filed: Oct. 26, 1998

[51] Int. Cl.[7] .................................................. B60R 13/02
[52] U.S. Cl. ........................................ 296/39.1; 296/146.7
[58] Field of Search .................. 29/849, 846; 296/146.7, 296/39.1, 70

[56] References Cited

U.S. PATENT DOCUMENTS

| | | |
|---|---|---|
| 3,800,020 | 3/1974 | Parfet . |
| 4,031,268 | 6/1977 | Fairbairn . |
| 4,263,341 | 4/1981 | Martyniak . |
| 4,403,818 | 9/1983 | Kleinb öhl . |
| 4,424,408 | 1/1984 | Elarde . |
| 4,775,439 | 10/1988 | Seeger, Jr. et al. . |
| 4,781,968 | 11/1988 | Kellerman . |
| 4,800,648 | 1/1989 | Nakayama et al. . |
| 4,818,236 | 4/1989 | Nakayama et al. . |
| 4,824,164 | 4/1989 | Nakayama et al. . |
| 4,848,829 | 7/1989 | Kidd . |
| 4,869,670 | 9/1989 | Ueda et al. . |
| 4,940,623 | 7/1990 | Bosna et al. . |
| 5,296,667 | 3/1994 | Marantz et al. . |
| 5,433,478 | 7/1995 | Naruse .......................... 296/146.7 X |
| 5,442,153 | 8/1995 | Marantz et al. . |
| 5,460,530 | 10/1995 | Toba et al. . |
| 5,808,270 | 9/1998 | Marantz et al. . |
| 5,891,527 | 4/1999 | Turek et al. . |
| 5,891,528 | 4/1999 | Turek et al. . |
| 5,910,524 | 6/1999 | Kalinoski . |

FOREIGN PATENT DOCUMENTS

| | | |
|---|---|---|
| 563359 | 9/1958 | Canada . |
| 3740593A | 6/1989 | Germany . |
| 3821121A | 2/1990 | Germany . |
| 3842340 A1 | 6/1990 | Germany . |
| 1193420 | 6/1970 | United Kingdom . |
| 2 164 609 | 3/1986 | United Kingdom . |
| 2 166 603 | 5/1986 | United Kingdom . |

*Primary Examiner*—Dennis H. Pedder
*Attorney, Agent, or Firm*—MacMillan, Sobanski & Todd, LLC

[57] ABSTRACT

A trim panel includes a plurality of ribs projecting from a surface of the trim panel. Fluent, conductive material is sprayed onto the ribs at an angle such that distinct electrical traces are formed on each rib. The gauge of each electrical trace can be determined by varying the height of each rib. The gauge of each electrical trace can also be determined by varying the angle of the rib relative to the surface of the trim panel.

13 Claims, 1 Drawing Sheet

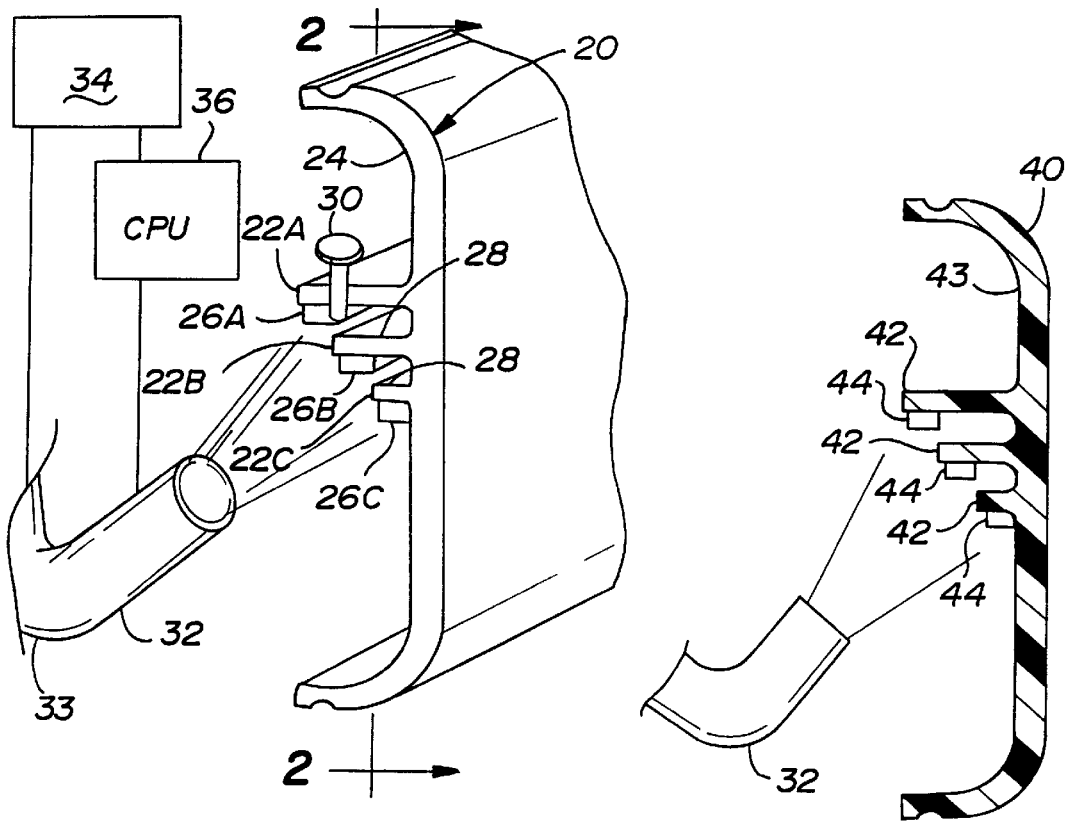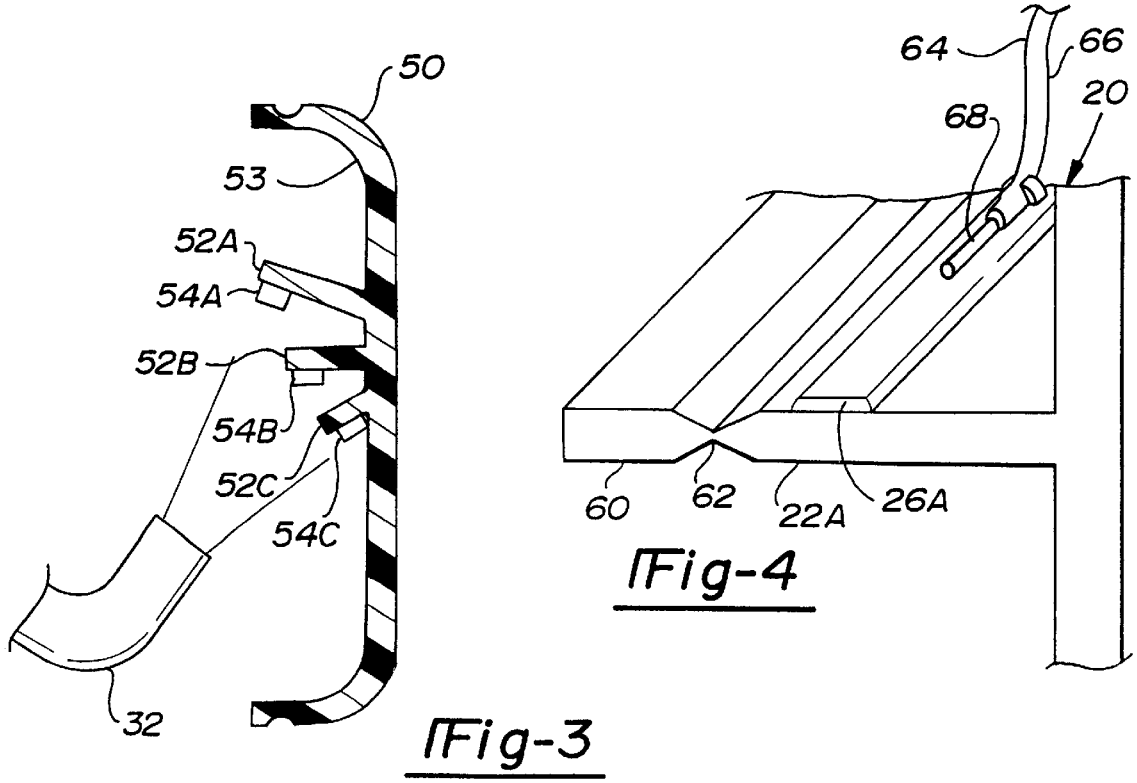

RIBBED TRIM PANEL FOR THERMAL SPRAYING OF ELECTRICAL CIRCUIT

BACKGROUND OF THE INVENTION

The present invention relates to wiring for vehicle trim panels and more particularly to an improved method for thermally spraying electrical circuits on interior trim panels utilizing integrally molded projections for defining the thermally sprayed traces.

Vehicles typically include a number of interior trim panels mounted to different surfaces, including a door trim panel mounted to the interior surface of a door. Typically vehicle door assemblies includes spaced apart inner and outer panels defining a cavity for mounting a window, window regulator, speakers and other electrical devices. These devices are installed inside the door cavity through a plurality of access openings provided in the door trim panel. The door trim panel conceals the interior surface of the door and the access openings. The door trim panel is conventionally formed of a rigid panel, such as molded plastic or pressed hardboard, and covered with a flexible decorative trim material such as cloth, vinyl, leather and/or carpeting.

The door trim panel also often supports a number of electrical components such as lights, window controls, rear view mirror controls, seat adjustment controls, and speakers. Each of these electrical components requires an individual wiring connector and power supply lead wires. The power supply lead wires for all the electrical components are typically bound together to create a wire harness. The wire harness is fixed to the door trim panel or to the door to prevent damage to the wire harness and to reduce noise. The mounting and wiring of these electrical components is labor intensive and requires a number of connectors and other electrical parts.

The assignee of the present invention has developed a technique for overcoming the disadvantages of the prior art door trim panel electrical wiring. In the improved interior trim panel, electrical wiring is provided by spraying a fluent, conductive material onto the trim panel to form electrical traces. Preferably, the fluent material is a flame sprayed metal. Such techniques are disclosed in co-pending application U.S. Ser. No. 09/053,395, entitled "Trim Panel With Integrally Formed Electrical Circuits" filed Apr. 1, 1998, which is hereby incorporated by reference. In this technique, a template having openings is applied to the interior surface of the trim panel. The electrical circuit is then deposited on the trim panel by flame spraying molten metal particles through the openings and onto the interior surface of the trim panel. The template is then removed from the trim panel. The electrical circuit is formed of the plurality of spaced apart traces, formed by the sprayed conductive material.

SUMMARY OF THE INVENTION

The present invention eliminates the need to use the template in spraying the electrical traces onto the trim panel. Preferably, the trim panel of the present invention includes a plurality of ribs extending from the interior surface of the trim panel. The height and angle of the ribs is selected in order to determine the amount of material forming the trace and thus, the resulting gauge of the trace. The plurality of ribs ensure that the sprayed material forms distinct traces (i.e., not conductive with each other) without the need for a template.

A single electrical trace is formed on or adjacent each rib. The thickness or gauge of the trace can be increased by increasing the height of the rib. In this manner, traces of varying gauge can be provided on a single trim panel. Further, the thickness of the trace can be increased by forming the rib at an angle, such that more material is deposited on the rib.

Connectors are formed upon portions of the ribs by integrally molding covers connecting by living hinges to a rib. The cover is hinged at the living hinge back onto the rib in order to secure another conductor, such as a wire, to the trace.

BRIEF DESCRIPTION OF THE DRAWINGS

The above, as well as other advantages of the present invention, will become readily apparent to those skilled in the art from the following detailed description of a preferred embodiment when considered in the light of the accompanying drawings in which:

FIG. 1 is a perspective view, partially broken away, of the door trim panel of the present invention;

FIG. 2 is a sectional view of an alternate embodiment of the door trim panel;

FIG. 3 is a sectional view of another alternate embodiment of the door trim panel; and FIG. 4 is a partial perspective view, partially broken away, of an additional feature of the door trim panel of FIG. 1.

DETAILED DESCRIPTION OF A PREFERRED EMBODIMENT

An interior trim panel for a vehicle 20 is shown partially broken away in FIG. 1. The trim panel 20 is illustrated as a door trim panel, but other interior trim panels, such as headliners, instrument panels, etc. could also be utilized. The trim panel 20 includes a plurality of ribs 22a–c extending from an interior surface 24 of the trim panel 20. The ribs 22 are parallel to each other and also extend generally longitudinally along the trim panel 20. In this embodiment, the rib 22a extends a greater height from the surface 24 than does rib 22b, which in turn extends a greater height than rib 22c. An electrical trace 26a–c is formed on each of the ribs 22a–c, respectively. Each of the electrical traces 26 also extends longitudinally along the ribs 22. The electrical traces 26 interconnect switches and/or electrical devices, such as motors, speakers, etc., which may be mounted on or adjacent to trim panel 20. As can be seen in FIG. 1, the difference in height between rib 22a and rib 22b is less than the difference between rib 22b and rib 22c.

The trim panel 20 may include electrical connectors, such as a metal pin 30, which may be insert molded with the rib 22a, making electrical contact with the trace 26a. Other electrical connectors are disclosed in co-pending applications U.S. Ser. No. 09/129,561, entitled Trim Panel Having Electrical Connectors, filed Aug. 5, 1998 and U.S. Ser. No. 09/129,741, entitled Trim Panel With Integrally Formed Electrical Circuits, filed Aug. 5, 1998, the assignee of which is the assignee of the present invention and which are hereby incorporated by reference.

The trim panel 20 is preferably formed of a molded plastic such as polypropylene. Alternatively, the trim panel 20 may be fabricated of wood fibers, polyurethane, vinyl, expanded polyurethane foam or accommodations thereof. The ribs 22 are preferably integrally molded with the trim panel 20.

In a method according to the present invention of making the trim panel 20, a sprayer 32, preferably mounted on a robot arm 33, sprays an electrically conductive fluid material, such as by flame spraying metal, onto the plurality of ribs 22. Preferably, the material 34 is sprayed at an acute angle relative to the ribs 22 and the surface 24. By directing the material 34 at an angle not parallel to the ribs 22, the ribs 22 insure that an insulating portion 28 is formed between each of the traces 26. For example, rib 22c prevents material 34 from forming on the surface of rib 22c between rib 22c and rib 22b. Similarly, rib 22b prevents material 34 from depositing between ribs 22b and 22a, thereby forming an insulating portion between each of the traces.

The movement of the robot arm 33 and sprayer 32 is controlled by CPU 36. CPU 36 also controls the flow of material 34 to sprayer 32. Preferably, the sprayer is moved longitudinally parallel to the ribs 22 along trim panel 20, maintaining the angle of the sprayer 32 relative to the ribs 22. By varying the differences in heights in adjacent pairs of ribs 22a/22b and 22b/22c, the gauges of the electrical traces 26 can be varied. For example, since there is a greater difference in height between adjacent ribs 22b/22c than 22a/22b, trace 26b will be thicker than that of trace 26a. Trace 26c, on the other hand, is dictated solely by its own height and the rate of spraying material 34. In this manner, traces 26 of varying gauges can be provided, so that the traces 26 each provide sufficient power to its corresponding electrical device, without utilizing excess material 34.

An alternate trim panel 40 is illustrated in FIG. 2 having a plurality of equally sized, equally spaced parallel ribs 42 extending from a surface 43 of trim panel 40. The material deposited by sprayer 32 forms electrical traces 44 of equal gauge.

Another alternate trim panel 50 is illustrated in FIG. 3 comprising a plurality of ribs 52a–c again extending generally longitudinally along trim panel 50 at generally equal, constant distances from each other. However, in trim panel 50, the ribs 52 extend at different angles from the surface 53 of the trim panel 50. Rib 52a extends at an obtuse angle (measured from the side on which the trace 54a is formed) relative to surface 53. Rib 52b extends generally perpendicular to surface 53. Rib 52c extends at an acute angle relative to surface 53, measured on the side of trace 54c. In this manner, when the sprayer 32 sprays the conductive material onto ribs 52, traces 54 are formed having different gauges. The rib 52a at an obtuse angle will form a trace 54a having a larger cross section and able to carry more power than traces 54b and 54c. The rib 52c at an acute angle will form a trace 54c having a smaller cross section and able to carry less power than traces 54a or 54b.

FIG. 4 illustrates an additional feature of the trim panel 20 of FIG. 1. A connector cover 60 may be integrally molded at an outer end of one of the ribs (for example rib 22a) outwardly of trace 26a and connected to rib 22a by a living hinge 62. A wire 64 comprising a conductor 68 generally encased by insulation 66 may be secured to the rib 22a, providing contact between conductor 68 and trace 26a by closing the cover 60 onto the rib 22a and securing cover 60 to the rib 22a by adhesive, snap-fit tabs or other means.

The different techniques described above with respect to FIGS. 1–3 for obtaining different gauges could be used together on a single trim panel. For example, the height, angle and difference in height of the ribs could be varied to form traces of different gauges. The connectors provided in FIG. 1 and 4 could also be utilized with any of the traces shown in FIGS. 1–4.

In accordance with the provisions of the patent statutes and jurisprudence, exemplary configurations described above are considered to represent a preferred embodiment of the invention. However, it should be noted that the invention can be practiced otherwise than as specifically illustrated and described without departing from its spirit or scope.

What is claimed is:

1. A vehicle trim panel assembly comprising:

a trim panel having a surface;

a plurality of ribs extending from said surface of said trim panel, each rib extending at a height with respect to said surface of said trim panel; and a plurality of electrical traces formed on said plurality of ribs, wherein a gauge of each electrical trace of the plurality of electrical traces is a function of a relative height between adjacent ribs.

2. The vehicle trim panel assembly according to claim 1, wherein each of said plurality of ribs are generally parallel with respect to each other.

3. The vehicle trim panel assembly according to claim 1, wherein at least one of said plurality of ribs extends at a first angle relative to said surface of said trim panel, and wherein at least another one of said plurality of ribs extends at a second angle relative to said surface of said trim panel, said first angle being different than said second angle.

4. The vehicle trim panel assembly according to claim 1, wherein said plurality of electrical traces are formed on said plurality of ribs by a sprayer.

5. The vehicle trim panel assembly according to claim 4, wherein said sprayer is controlled by a CPU.

6. The vehicle trim panel assembly according to claim 4, wherein said sprayer is mounted on a robot arm.

7. The vehicle trim panel assembly according to claim 6, wherein said sprayer is moved longitudinally parallel relative to said plurality of ribs, thereby maintaining an angle of said sprayer relative to said plurality of ribs.

8. The vehicle trim panel assembly according to claim 1, further including a cover hingedly connected to at least one rib of said plurality of ribs.

9. A vehicle trim panel assembly comprising:

a trim panel having a surface;

a plurality of ribs extending from said surface of said trim panel, each rib extending at a height with respect to said surface of said trim panel; and a plurality of electrical traces formed on said plurality of ribs by a sprayer, wherein a gauge of each electrical trace of said plurality of electrical traces varies as a function of an angle of said sprayer relative to each of said plurality of ribs.

10. The vehicle trim panel assembly according to claim 9, wherein said sprayer is controlled by a CPU.

11. The vehicle trim panel assembly according to claim 9, wherein said sprayer is mounted on a robot arm.

12. The vehicle trim panel assembly according to claim 11, wherein said sprayer is moved longitudinally parallel relative to said plurality of ribs, thereby maintaining an angle of said sprayer relative to said plurality of ribs.

13. The vehicle trim panel assembly according to claim 9, further including a cover hingedly connected to at least one rib of said plurality of ribs.

* * * * *